United States Patent [19]
Ashtiani et al.

[11] Patent Number: 6,166,549
[45] Date of Patent: Dec. 26, 2000

[54] ELECTRONIC CIRCUIT FOR MEASURING SERIES CONNECTED ELECTROCHEMICAL CELL VOLTAGES

[75] Inventors: Cyrus N. Ashtiani, West Bloomfield, Mich.; Thomas A. Stuart, Toledo, Ohio

[73] Assignees: DaimlerChrysler Corporation, Auburn Hills, Mich.; University of Toledo, Toledo, Ohio

[21] Appl. No.: 09/224,466

[22] Filed: Dec. 31, 1998

[51] Int. Cl.[7] .................................................. G01N 27/416
[52] U.S. Cl. ........................................... 324/434; 320/136
[58] Field of Search .................................. 324/434, 430, 324/431; 320/136

[56] References Cited

U.S. PATENT DOCUMENTS

| | | | |
|---|---|---|---|
| 5,646,534 | 7/1997 | Kopera | 324/434 |
| 5,710,503 | 1/1998 | Sideris | 324/431 |
| 5,760,488 | 6/1998 | Sonntag . | |
| 5,808,469 | 9/1998 | Kopera | 324/434 |
| 5,824,432 | 10/1998 | Currle . | |
| 5,831,514 | 11/1998 | Hilpert et al. . | |
| 5,945,829 | 8/1999 | Bertness | 324/430 |

*Primary Examiner*—Safet Metjahic
*Assistant Examiner*—James C Kerveros
*Attorney, Agent, or Firm*—Roland A. Fuller, III

[57] ABSTRACT

An electronic circuit for measuring voltage signals in an energy storage device is disclosed. The electronic circuit includes a plurality of energy storage cells forming the energy storage device. A voltage divider circuit is connected to at least one of the energy storage cells. A current regulating circuit is provided for regulating the current through the voltage divider circuit. A voltage measurement node is associated with the voltage divider circuit for producing a voltage signal which is proportional to the voltage across the energy storage cell.

18 Claims, 2 Drawing Sheets

ELECTRONIC CIRCUIT FOR MEASURING SERIES CONNECTED ELECTROCHEMICAL CELL VOLTAGES

STATEMENT REGARDING FEDERALLY SPONSORED RESEARCH OR DEVELOPMENT

This invention was made with Government support under NREL subcontract number ZAN-6-16334-01, prime contract number DE-AC36-83CH10093 issued by the Department of Energy. The government has certain rights in this invention.

BACKGROUND OF THE INVENTION

1. Technical Field

The present invention generally relates to an electronic circuit for an energy storage device management system. More particularly, the present invention is directed to an electronic circuit for efficiently and accurately measuring individual voltages in a series connected electrochemical energy storage device which may be utilized with electric and hybrid vehicles.

2. Discussion

In order to commercialize electric and hybrid vehicles on a widespread basis, the energy storage devices or batteries, which are the most expensive component of the vehicle, must operate reliably through the life of the vehicle. In the typical configuration the batteries are formed from a stack of series connected electrochemical cells.

A common requirement for large stacks of electrochemical cells used in electric and hybrid vehicles, particularly in advanced applications such as lead acid, Li-Ion or NiMH battery packs, is the need to measure individual or groups of cell voltages almost simultaneously. In practice, this means the measurements should be taken within a time window of a few milliseconds.

With reference to FIG. 1, a common technique known within the prior art accomplishes voltage measurement through the use of a plurality of resistive divider circuits. More specifically, FIG. 1 shows an exemplary battery pack 10 having forty-eight energy storage cells B1 through B48 connected in series. A resistive voltage divider circuit 12 is connected between the positive terminal 16 of battery cells B2 through B48 and a common ground node 14. The discrete resistances $R_1, R_2, \ldots, R_n$ are selected such that the output potentials $V_{m1}, V_{m2}, \ldots, V_{mn}$ fall below a certain voltage limit, for example 4 volts, suitable for input to a multiplexer and A/D converter. The voltage signals from each resistive divider circuit 12 can then be sampled and digitally processed. The actual nodal voltages $V_1, V_2, V_3, \ldots, V_{48}$ become increasingly higher towards the top of the battery pack 10, such that in general:

$$V_{mn} = V_n \cdot k_n = V_n \cdot \frac{R_1}{R_1 + R_n} = 4V \Rightarrow V_n = \frac{V_{mn}}{k_n}; \forall n = 1, 2, \ldots$$

The voltage across each cell segment $V_{B1}, V_{B2}, \ldots, V_{B48}$ is then computed as the difference between the nodal voltages measured on either side of the cell according to the formula:

$$V_{Bn} = V_n - V_{n-1}$$

For example, the voltage $V_{B3}$ of cell B3 is measured by taking the difference between $V_3$ and $V_2$ provided by the respective voltage divider circuits 12.

The principal problem with this technique of voltage measurement is that a small error in measuring the nodal voltages $V_n$ translates into a large relative error in the measurement of segment voltages $V_{Bn}$. These errors increase as the nodal voltages $V_n$ become increasingly larger towards the top or higher potential cells of the battery pack 10. For example, suppose:

$$k_{48} = \frac{1}{48}, \quad k_{47} = \frac{1}{47}$$

$$V_{n48} = V_{48} \cdot k_{48} = 4V, \Rightarrow V_{48} = 192V,$$
$$V_{n47} = V_{47} \cdot k_{47} = 4V, \Rightarrow V_{47} = 188V,$$

$$\therefore V_{B48} = V_{48} - V_{47} = 4V.$$

If $k_{48}$ is in error by $\epsilon=1\%$, and $k_{47}$ is in error by $\epsilon=-1\%$, measurements of the nodal voltages indicate:

$$V_{48} = 193.92V; \quad V_{47} = 186.12V$$

$$V_{B49} = 7.8V., \text{ error} = 95\%$$

Thus, the measurement error associated with this network of resistive divider circuits 12 and measurement technique could be in excess of 95%.

Furthermore, this error is nonuniformly distributed between the cell segments varying from a maximum of $2\epsilon$ percent at the bottom to a maximum of $2n \times \epsilon$ percent at the top of the battery pack 10. The latter renders this approach useless in applications where comparison of the cell segment voltages are used for diagnostics or corrective actions such as in cell balancing. Lastly, this conventional resistance network continues draining the cells of the battery pack 10 even when the resistance network is not in use.

While not specifically shown, a matrix of electromechanical relays can also be used for selectively switching across the cell segments of the battery pack. This approach results in slow measurement of cell voltages and is therefore not suitable for modern applications. In addition, such a relay based device also becomes too bulky and heavy for use with an electric or hybrid vehicle. Higher speed and accuracy can be achieved using a separate isolation amplifier for each battery segment, but this approach results in a relatively large and expensive system.

Accordingly, it is desirable to provide an electronic circuit for overcoming the disadvantages known within the prior art. It is also desirable to provide an electronic circuit which allows for a high degree of accuracy when measuring both the lowest potential cell voltages and the highest potential cell voltages. Moreover, it is desirable to provide a highly efficient electronic circuit which minimizes any loss within the circuit. Finally, it is desirable to provide an electronic circuit with various switched components to prevent the leakage of current from the energy storage device when the circuit is not being used.

SUMMARY OF THE INVENTION

According to the teachings of the present invention, a circuit for measuring the individual cell voltages within an energy storage device is disclosed. The circuit includes at least one electronic circuit connected to the energy storage device for producing an output voltage which is proportional to an individual cell voltage. The electronic circuit includes a first current branch and a second current branch. The circuit causes the current in each branch to be nearly equal, in order to produce the output voltage which is proportional to the cell voltage. In one embodiment of the invention, a multiplexing and sampling circuit provides digitized voltage samples to a processor. The voltage level of each cell within the battery pack can then be monitored by the processor.

BRIEF DESCRIPTION OF THE DRAWINGS

Additional objects, advantages and features of the present invention will become apparent from the following description and appended claims, taken in conjunction with the accompanying drawings in which:

DETAILED DESCRIPTION OF THE PREFERRED EMBODIMENT

Figure 1:
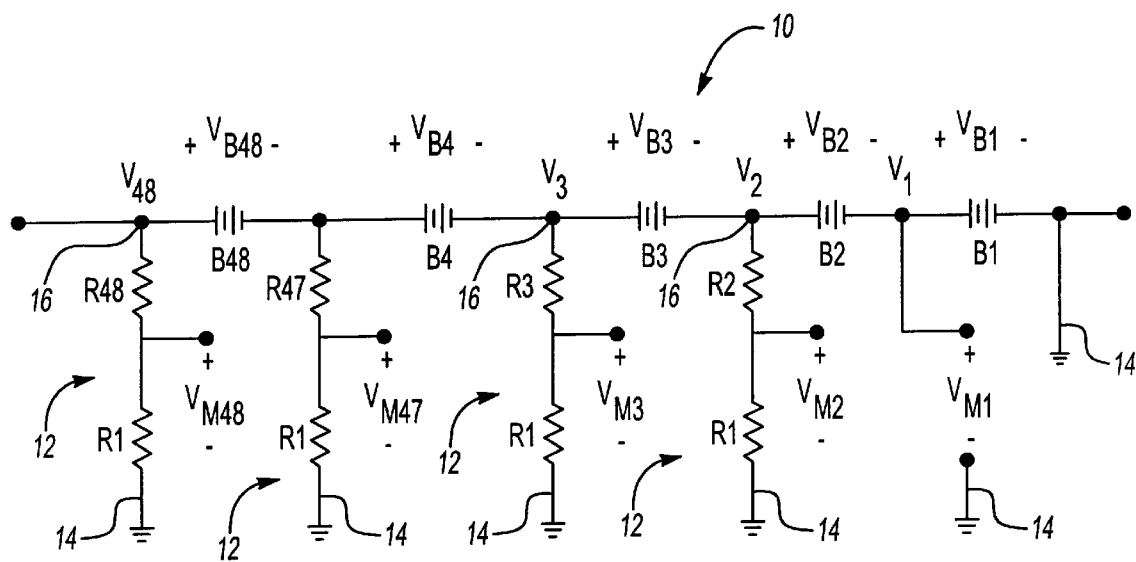
FIG. 1 is a schematic diagram of a prior art resistive voltage divider circuit used in conjunction with a series battery pack.
Figure 2:
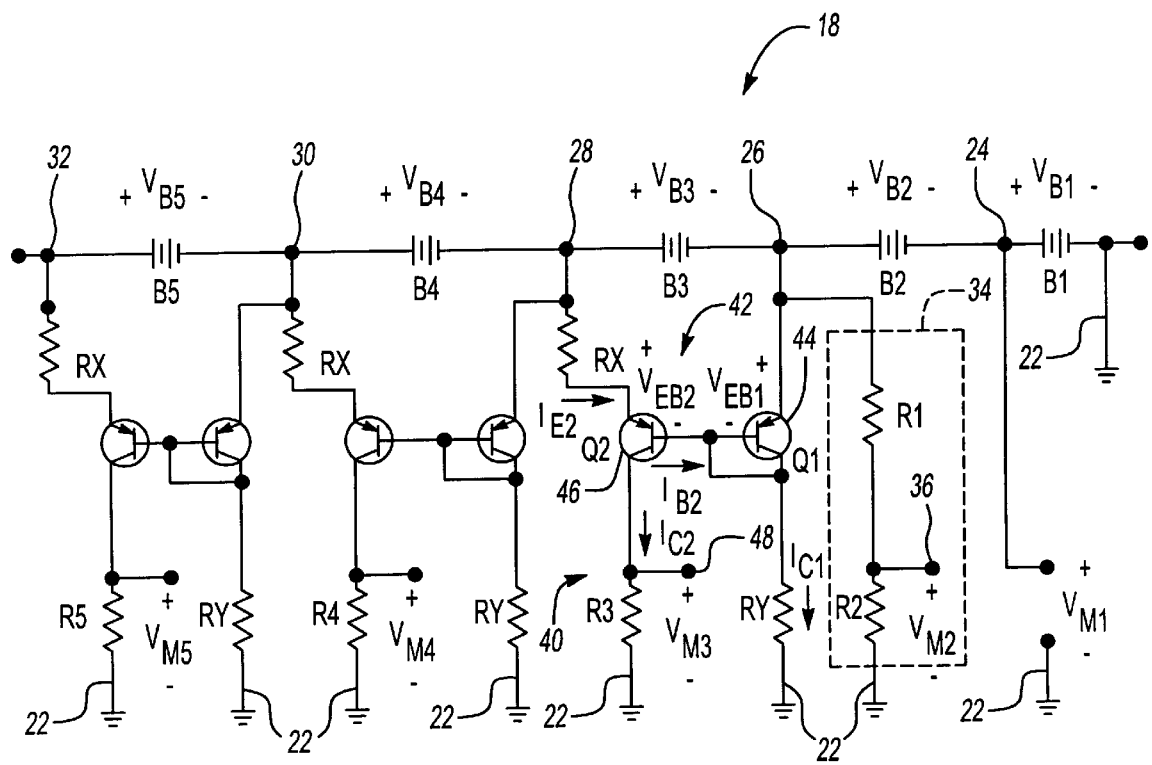
FIG. 2 is a schematic diagram of the electronic circuit for a series battery pack in accordance with a preferred embodiment of the present invention.

Turning now to FIG. 2, the electronic voltage measuring circuit of the present invention is shown. The voltage measuring circuit 18 operates in conjunction with a series of five energy storage cells B1 through B5 forming battery pack 20. As shown, node 22 is the common ground node which is also connected to the negative terminal of battery B1. Node 24 forms the connection between the positive terminal of battery B1 and the negative terminal of battery B2. Node 26 forms the connection between battery B2 and battery B3. Node 28 forms the connection between battery B3 and battery B4. Node 30 forms the connection between battery B4 and battery B5. Finally, node 32 forms the connection to the positive terminal of battery B5.

A resistive voltage divider circuit 34 is connected between node 26 and the common ground node 22. The voltage divider circuit 34 is formed by resistor R1 and resistor R2 with a voltage measurement node 36 disposed therebetween. The electronic circuit 40 of the present invention is connected across battery B3 using nodes 26 and 28. The electronic circuit 40 includes a temperature compensation circuit 42 which is formed by a first pnp transistor 44 and a second pnp transistor 46. As shown, the bases of transistors 44 and 46 are connected together, and are commonly connected to the collector of transistor 44. Thus, the temperature compensation circuit 42 functions as a current mirror within electronic circuit 40 and assists in isolating the voltage across its associated battery cell segment B3, so that the cell voltage $V_{B3}$ can be measured with a significantly higher degree of accuracy.

The emitter of transistor 44 is connected to node 26, and the collector of transistor 44 is connected to biasing resistor Ry, which is then connected to the common ground node 22. The emitter of transistor 46 is connected to resistor $R_X$, which is in turn connected to node 28, and the collector of transistor 46 is connected to resistor R3. The collector of transistor 46 also forms the voltage measurement node 48. As will be appreciated, resistor $R_X$ and resistor R3 form the primary measurement components of the electronic circuit 40. Additionally, identical electronic circuits 40 are also connected across battery cells B4 and B5, and function in a substantially similar manner.

Figure 3:
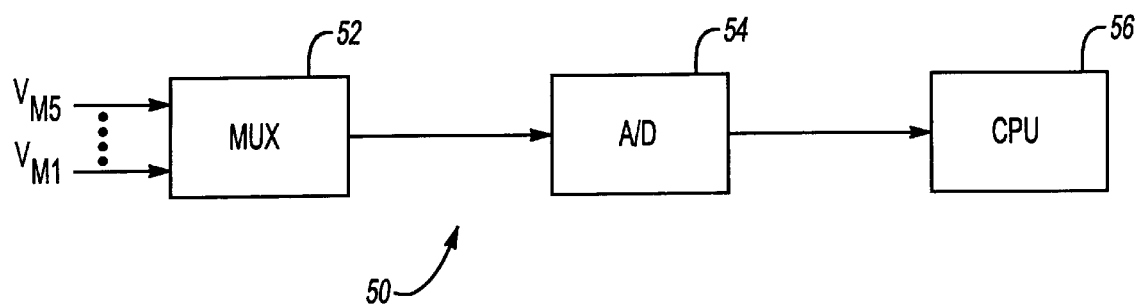
FIG. 3 is a schematic diagram of the multiplexing and sampling circuit in accordance with the present invention.

With brief reference to FIG. 3, the processing circuit 50 associated with the voltage measuring circuit 18 of the present invention is shown. The processing circuit 50 includes a multiplexer 52 which receives the individual cell segment voltage signals $V_{m1}$ through $V_{m5}$ from the individual electronic voltage measurement circuits 40, the resistive voltage divider circuit 34, and voltage node 24. The output of multiplexer 52 is provided to an A/D converter 54 so that the individual voltage signals can be digitally sampled and communicated to a suitable processor 56. The processor 56 is then able to directly monitor the individual cell segment voltages, and use this information for functions such as cell diagnostics and cell equalization.

The present invention involves a modification to the resistive voltage divider circuit, disclosed in FIG. 2, that creates a voltage signal across the measuring resistances $R_3$, $R_4$, $R_5$, ..., $R_n$ which is directly proportional to the actual battery cell segment voltages $V_{B3}$, $V_{B4}$, $V_{B5}$, ..., $V_{Bn}$ that are being measured.

In operation, the electronic circuit 40 of the present invention is described in conjunction with a battery pack of five v lithium ion cells as shown in FIG. 2. Assuming the A/D converter 54 can measure voltages up to +5V DC, $V_{B1}$ can be measured directly from node 24 which produces voltage signal $V_{m1}$, and $V_{B2}$ can be measured using a ±1% resistive divider circuit 34 from node 36 which produces voltage signal $V_{m2}$ and then subtracting the $V_{B1}$ measurement. For $V_{B3}$, note that $$V_{B3} = I_{E2}R_X + V_{EB2} - V_{EB1}$$

If $R_X$ and $R_Y$ are so selected and Q1 and Q2 are operated so that, $V_{EB2} \equiv V_{EB1}$, then from above:

$$V_{B3} = I_{E2}R_X$$

Since $I_{E2} >> I_{B2}$, then $I_{E2-IB2} + I_{C2} = I_{C2}$, and $$\frac{V_{B3}}{V_{m3}} = \frac{I_{E2}R_X}{I_{C2}R_3} = \frac{R_X}{R_3}$$

In this circuit a direct measurement of $V_{m3}$ will be proportional to the voltage across the cell segment $V_{B3}$ and the measurement error will be $\epsilon\%$ uniformly across the stack provided that $V_{EB1}$ and $V_{EB2}$ are approximately equal. As will be appreciated, the electronic circuit 40 of the present invention allows for the measurement of the voltage across each battery cell segment with a significantly higher degree of accuracy. Accordingly, the higher potential battery cell segments can be measured with nearly the same degree of accuracy as the lower potential battery cell segments because the electronic circuit 40 serves to measure only the voltage across an isolated battery cell segment, rather than measure the voltage potential of the cell segment with respect to ground.

In the actual implementation, $V_{EB1}$ and $V_{EB2}$ cannot be matched perfectly, but if transistors 44 and 46 are mounted or formed in the same package, they can easily be matched within a few millivolts with respect to both initial tolerance and wide temperature ranges. This provides a very small and inexpensive measurement system which has about the same tolerance as the components. As will be appreciated by one skilled in the art, the remaining voltage measurements $V_{B4}$, $V_{B5}$, ..., $V_{Bn}$ are performed in the same manner as $V_{B3}$. As part of the present invention, it should be noted that the resistance values are chosen such that $R_2=R_3=R_4=R_5$ and $R_1=R_X$.

An alternate less preferred approach employs discrete transistors rather than a matched pair of transistors. Using discrete devices reduces the cost of the circuit and improves manufacturability, but increases the error associated with the voltage measurement. The increased error is caused by using separate pieces of silicon to fabricate the transistors and the differences in the operating temperature of each discrete device. The increased error associated with employing discrete devices is a function of the amplitude of the segment voltage that is being measured. Larger valued segment voltages result in a decreased error associated with mismatching of the transistor $V_{EB}$'s. For example, assuming a $V_{EB}$ mismatch of 0.2 volts and a nominal segment voltage of 4 volts, the error due to $V_{EB}$ mismatch is 5%.

Figure 4:
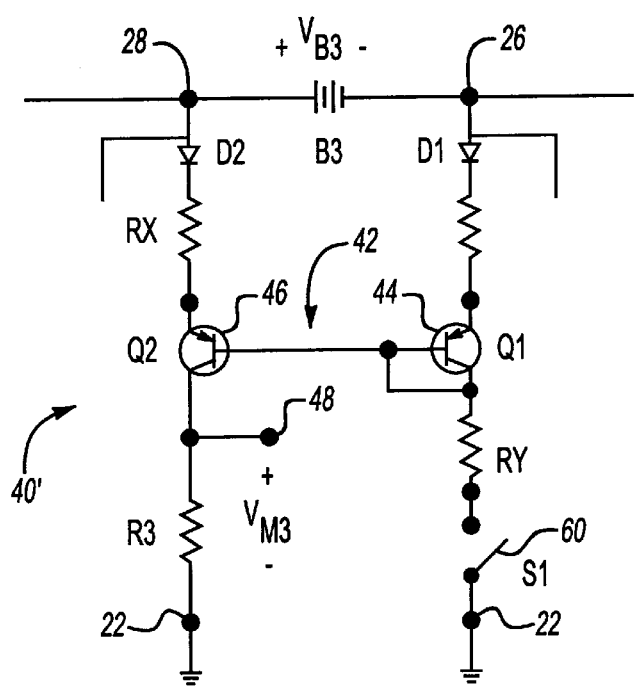
FIG. 4 is an electronic circuit having on-off control for minimizing leakage current for use with a series battery pack in accordance with an alternate preferred embodiment of the present invention.

An alternate embodiment of the electronic circuit of the present invention is disclosed in FIG. 4. The components of the electronic circuit 40' are substantially similar to those of the circuit shown in FIG. 2. As an additional feature, a switch 60 is connected between the resistor Ry and the common ground node 22. According to this embodiment of the electronic circuit 40', no current will flow through either side of the temperature compensation circuit 42 until switch 60 is closed. As part of the present invention, the switch 60 can be implemented with a semiconductor switch.

The anode of a diode D1 is connected to node 26, or the negative terminal of the battery cell B3, and the cathode is connected to transistor 44. The diode D1 prevents reverse $V_{EB2}$ avalanche and the resulting battery leakage current if $V_{B3}$ is above approximately 5–6V. The anode of a diode D2 is connected to node 28, or the positive terminal of the battery cell B3, and the cathode is connected to resistor $R_X$. The diode D2 is required for temperature compensation of diode D1.

The foregoing discussion discloses and describes exemplary embodiments of the present invention. One skilled in the art will readily recognize from such discussion, and from the accompanying drawings and claims, that various changes, modifications, and variations can be made therein without departing from the spirit and scope of the invention as defined in the following claims.

What is claimed is:

1. A voltage measuring circuit for measuring voltage signals in an energy storage device comprising:

a plurality of energy storage cells forming the energy storage device;

a voltage divider circuit connected to at least one of the energy storage cells whereby each of the energy storage cells has an isolated battery cell segment voltage;

an electronic circuit for representing the isolated battery cell segment voltage as a proportional voltage referenced to ground; and a voltage measurement node associated with the electronic circuit for producing a voltage signal which is proportional to the voltage across the isolated battery cell segment.

2. The electronic circuit of claim 1 wherein the voltage divider circuit is a resistive voltage divider circuit.

3. The electronic circuit of claim 2 wherein the resistive voltage divider includes a first resistor and a second resistor, and wherein the voltage measurement node is disposed therebetween.

4. The electronic circuit of claim 1 wherein the electronic circuit is a current mirror.

5. The electronic circuit of claim 4 wherein the current mirror is connected across the energy storage cell for regulating the current through the voltage divider circuit.

6. The electronic circuit of claim 4 wherein the current mirror includes a first transistor and a second transistor, and the base of the first transistor is connected to the base of the second transistor.

7. The electronic circuit of claim 1 wherein the voltage signal is sampled by an A/D converter for monitoring by a processor.

8. The electronic circuit of claim 7 wherein a multiplexer receives a plurality of voltage signals and provides a single output to the A/D converter.

9. The electronic circuit of claim 1 wherein a switch is connected to the current regulating circuit.

10. An electronic circuit for measuring voltage signals in an energy storage device having a plurality of energy storage cells, the circuit comprising:

at least one current mirror circuit connected across one of the energy storage cells for converting a differential voltage to a reference current, the at least one current mirror circuit including a temperature compensation circuit, a second resistor and a third resistor;

said temperature compensation circuit including two base connected transistors and a first resistor for developing the reference current;

the second resistor connected to a collector of one of the base connected transistors for converting the reference current to a representative voltage; and the third resistor connected to a collector of the other base connected transistor for drawing a compensating current proportional to the reference current; and a voltage divider circuit connected to at least one of the energy storage cells.

11. The electronic circuit of claim 10 wherein the voltage divider circuit is a resistive voltage divider circuit.

12. The electronic circuit of claim 11 wherein only one voltage divider circuit is connected to an energy storage cell.

13. The electronic circuit of claim 10 wherein the two base connected transistors are a matched pair of pnp transistors.

14. The electronic circuit of claim 10 wherein the two base connected transistors are discrete pnp transistors.

15. The electronic circuit of claim 10 wherein the first resistor connects from the two base connected transistors to a positive node of the energy storage cell.

16. The electronic circuit of claim 10 wherein the first resistor connects from the two base connected transistors to a negative node of the energy storage cell.

17. The electronic circuit of claim 10 further comprising a shutdown circuit for disabling the current mirror circuit thereby reducing power consumption;

the shutdown circuit including a switch in series with the third resistor for preventing current flow during a shutdown mode, a first diode connected in series with the first resistor for protecting a Vbe junction of one base connected transistor, and a second diode connected in series with a Vbe junction of the other base connected transistor.

18. An electronic circuit for measuring voltage signals in an energy storage device comprising:

a plurality of energy storage cells forming the energy storage device;

at least one current mirror circuit connected across one of the energy storage cells for converting a differential voltage to a reference current, the at least one current mirror circuit including a temperature compensation circuit, a second resistor and a third resistor;

said temperature compensation circuit including two base connected transistors, a first diode connected in series with a first resistor for developing the reference current, and a second diode connected to an emitter of one of the base connected transistors;

the second resistor connected to a collector of one of the base connected transistors for converting the reference current to a representative voltage; and the third resistor connected to a collector of the other base connected transistor for drawing a compensating current proportional to the reference current;

a switch in series with the third resistor operative to disable the at least one current mirror circuit; and a voltage divider circuit connected to one of the energy storage cells.

* * * * *